United States Patent [19]

Sambandan

[11] Patent Number: 5,418,479
[45] Date of Patent: May 23, 1995

[54] METHOD AND CIRCUITRY FOR GENERATING A SAFE ADDRESS TRANSITION PULSE IN A MEMORY DEVICE

[75] Inventor: Sachidanandan Sambandan, Folsom, Calif.

[73] Assignee: Intel Corporation, Santa Clara, Calif.

[21] Appl. No.: 174,877

[22] Filed: Dec. 27, 1993

[51] Int. Cl.$^6$ .......................................... H03K 19/003
[52] U.S. Cl. ..................................... 326/93; 327/176; 327/384; 365/233.5
[58] Field of Search ...................... 307/480, 443, 542.1; 365/233.5; 326/93; 327/176, 384

[56] References Cited

U.S. PATENT DOCUMENTS

| | | | |
|---|---|---|---|
| 3,508,079 | 4/1970 | Moll et al. | 307/542.1 |
| 4,479,065 | 10/1984 | Aizawa | 307/542.1 |
| 4,630,239 | 12/1986 | Reed et al. | 365/189 |
| 4,717,885 | 1/1988 | Takeuchi | 307/480 |
| 4,843,596 | 6/1989 | Miyatake et al. | 365/233.5 |
| 4,883,993 | 11/1989 | Confalonieri et al. | 307/542.1 |
| 4,922,122 | 5/1990 | Dubujet | 307/480 |
| 5,073,872 | 12/1991 | Masuda et al. | 365/189.05 |
| 5,124,584 | 6/1992 | McClure | 307/480 |
| 5,198,708 | 3/1993 | Gillingham | 307/480 |
| 5,243,575 | 9/1993 | Sambandan et al. | 365/233.5 |

*Primary Examiner*—Edward P. Westin
*Assistant Examiner*—Benjamin D. Driscoll
*Attorney, Agent, or Firm*—Blakely, Sokoloff, Taylor & Zafman

[57] ABSTRACT

Noise on address lines is prevented from causing incomplete preparation for reading data after an address transition is detected. One ensures that a flash memory device reads correct data by guaranteeing that each address transition detection, including false address transition detections caused by noise, permits sufficient preparation to read data reliably. An address detected pulse is generated whenever at least one bit of an address changes. If noise causes an invalid address transition detected pulse that is too short to occur, the short pulse will be extended to permit preparation for the memory to be read. Input summation circuitry receives an input pulse and combines the input pulse with a feedback signal to form an input sum signal. Feedback circuitry receives the input sum signal and outputs the feedback signal to the input summation circuitry. The feedback signal holds the input sum signal until the feedback circuit is reset. Delay circuitry receives the input sum signal and, after a predetermined delay, provides as output a delayed signal that prepares the delay circuitry to reset and that also causes the feedback circuitry to reset (i.e., no longer output the feedback signal). Cessation of the input sum signal causes the delay circuitry to reset and halt output of the delay signal. Output summation circuitry receives the input sum signal and combines the input sum signal with the delay signal to form an output sum signal.

21 Claims, 6 Drawing Sheets

METHOD AND CIRCUITRY FOR GENERATING A SAFE ADDRESS TRANSITION PULSE IN A MEMORY DEVICE

FIELD OF THE INVENTION

The present invention relates to nonvolatile semiconductor memories. In particular, the present invention relates to a method and circuitry for generating address transition detection pulses for a nonvolatile semiconductor memory.

BACKGROUND OF THE INVENTION

One prior nonvolatile semiconductor memory is the flash electrically erasable programmable read-only memory ("flash"). Flash memories are programmed electrically and, once programmed, retain their data until erased. After erasure, flash memories may be programmed with new code or data.

Flash memories differ from conventional electrically erasable programmable read-only memories ("EEPROM") with respect to erasure. Conventional EEPROMs typically use a select transistor for individual byte erasure control. Flash memories, on the other hand, typically achieve much higher densities using single transistor cells. Some prior flash memories are erased by applying a high voltage to the sources of every memory cell in the memory array simultaneously. This results in the full array erasure.

Flash memory conventions define a logical one as a state where few, if any, electrons are stored on the floating gate of a memory cell. Convention also defines a logical zero as the state where many electrons are stored on the floating gate of the memory cell. Erasure of the flash memory causes a logical one to be stored in each bit cell. Flash memory cells cannot be overwritten individually from a logical zero to a logical one without prior erasure. A flash memory cell can be overwritten individually from a logical one to a logical zero, however, because this entails simply adding the intrinsic number of electrons associated with the erased state to a floating gate.

The process for erasure, programming and verification of flash memories requires careful control of the voltages used to perform those steps. For example, one prior art flash memory is the 28F008 complimentary metal oxide semiconductor ("CMOS") flash memory sold by Intel Corporation of Santa Clara, Calif., which is an 8 megabit flash memory. Commands for reading, writing, and erasing are issued from a controlling microprocessor using standard microprocessor read and write timings. The flash memory includes a command register to manage electrical erasure and reprogramming. The command register contents serve as input to an internal state machine that controls reading, erasure and programming circuitry.

Address transition detection ("ATD") is also well known in the art and has been widely used in static read only memory (SRAM) and EPROMs. The purpose of address transition detection circuitry is to increase the speed with which data can be read from memory. This is accomplished by causing preparation circuitry to perform operations which are required for every memory read operation as soon as an address transition has been detected.

These operations include equalizing sense amplifiers and latching the previous output. The sense amplifiers are used to increase weak signals sensed from the memory cells to be read during the read operation. Equalizing the sense amplifiers causes the amplifiers to be cleared or otherwise set up so that they are ready to process the new data to be read. Latching the previous output causes the output to remain static until the new data from the read operation has been output from the sense amplifiers. The previous output is latched because the output of the sense amplifiers fluctuates before it finally reaches a steady value. Latching the previous output ensures that the swing does not pass down to the outputs.

Circuitry to equalize the sense amplifiers and latch previous output is well known in the art. In fact, both operations are normally performed during a memory read operation. The address detection circuitry simply permits these operations to be performed earlier than would be the case where address transition detection is not employed.

Noise on address lines, however, can cause an ATD scheme to fail. This is because there typically is a minimum amount of time required for the preparation circuitry (e.g. sense amplifiers and output latches) to reach a ready state where the read operation can be performed. If the noise causes a short duration ATD pulse that is shorter than the minimum time necessary for the preparation circuitry to stabilize, then the preparation circuitry will enter an unknown state and may cause unreliable data to be read.

One approach to handling address noise is to filter out any ATD pulses that are shorter than the minimum amount of time necessary for the preparation circuitry to reach a ready state. A method and circuitry for implementing this approach is set forth in co-pending patent application 07/901,276, filed Jun. 19, 1992. This filtering circuitry uses two delay chains. Each delay chain occupies precious area on the memory chip.

SUMMARY OF THE INVENTION

One object of the present invention is to provide address transition detection to nonvolatile semiconductor memory in a environment where there is noise on the address signal lines.

Another object of the present invention is to guarantee generation of a minimum duration address transition detected pulse.

Another object of the present invention is to minimize the chip area required to guarantee generation of a minimum duration address transition detected pulse.

The purpose of the method and circuit of the present invention is to prevent noise on address lines from causing incomplete preparation for reading data after an address transition is detected. Guaranteeing that each address transition detection, including false address transition detections caused by noise, permits sufficient preparation to read data reliably. Thus, the circuit of the present invention ensures that the nonvolatile semiconductor ("flash") memory device reads correct data. In the case where an actual address transition occurs, the data stored at the new address will be read. In the case where noise causes a false transition detection, the short false detection pulse will cause the address previously read to be read again.

These and other objects of the present invention are achieved by a safe pulse generation circuit that has as its input an address transition detected pulse and has as its output a safe address transition detected pulse. The address detected pulse is generated whenever at least one bit of an address changes. If noise causes an invalid address transition detected pulse that is too short to occur, the short address transition detected pulse will be extended to the minimum amount necessary to permit the preparation for the memory to be read.

A safe pulse generator has input and output summation, feedback and delay circuitry. The input summation circuitry receives an input pulse and combines the input pulse with a feedback signal to form an input sum signal. The feedback circuitry receives the input sum signal and generates and outputs the feedback signal to the input summation circuitry. The feedback signal holds the input sum signal until the feedback circuit is reset. The delay circuitry receives the input sum signal and, after a predetermined delay, provides as output a delayed signal. The delay signal prepares the delay circuitry to reset. The delayed signal also causes the feedback circuitry to reset and therefore no longer output the feedback signal. The cessation of the input sum signal causes the delay circuitry to reset and halt the output of the delay signal. The output summation circuitry receives the input sum signal and combines the input sum signal with the delay signal to form an output sum signal. Because the safe pulse generator only has one delay chain, it uses less area on the memory chip than prior art noise filters.

Other objects, features, and advantages of the present invention will be apparent from the accompanying drawings and the detailed description that follows.

BRIEF DESCRIPTION OF THE FIGURES

The present invention is illustrated by way of example and not limitation in the figures of the accompanying drawings in which references indicate similar elements and in which.

DETAILED DESCRIPTION

Figure 1:
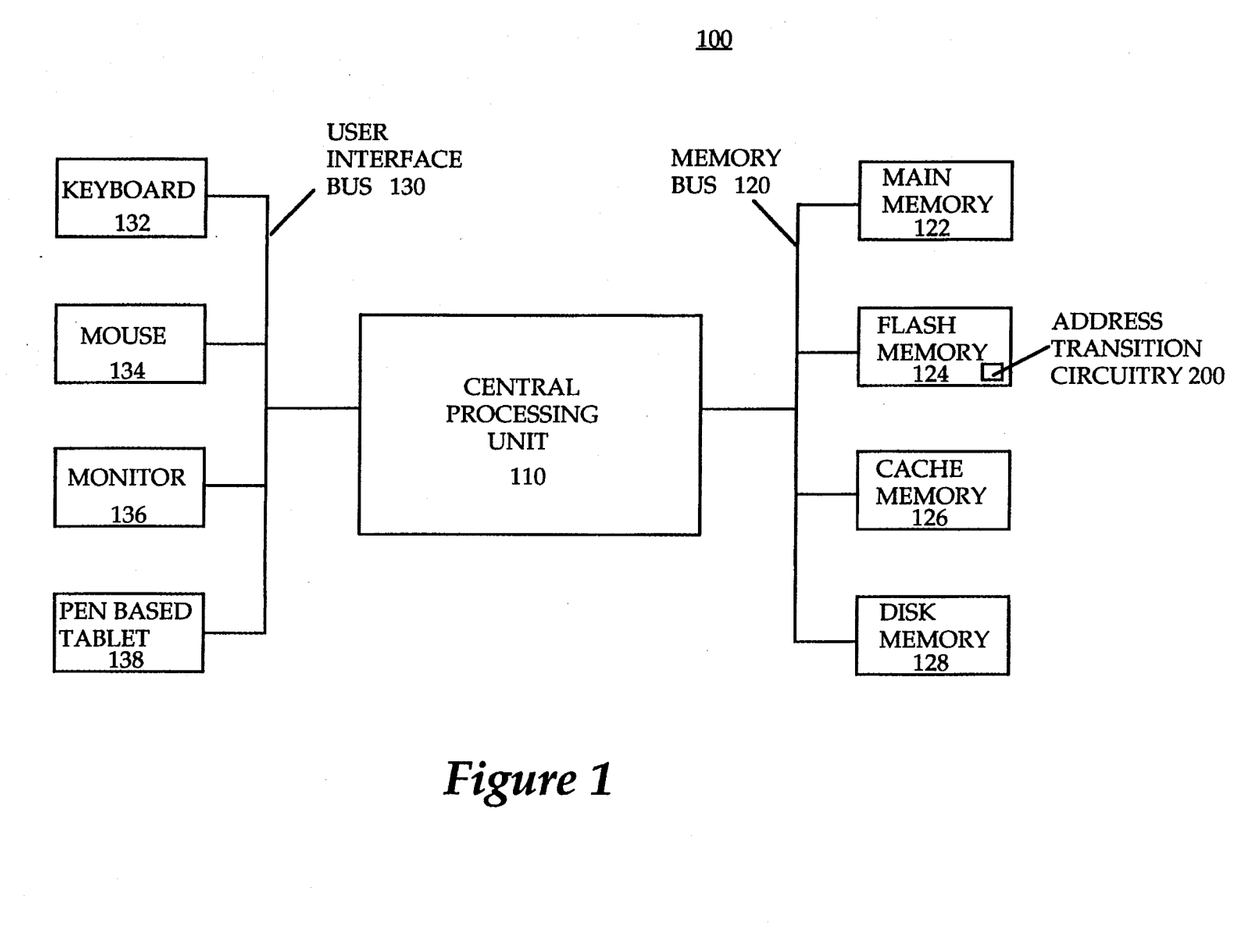
FIG. 1 illustrates a computer system that includes a nonvolatile memory device that has address transition detection circuitry of the present invention.

FIG. 1 illustrates a computer system that includes a flash memory device that has address transition detection circuitry. In computer system 100, central processing unit 110 is shown coupled to various input/output devices over user interface bus 130. Furthermore, central processing unit 110 is coupled to various memory devices over memory bus 120. Although user interface bus 130 and memory bus 120 are shown in FIG. 1 as being separate buses, in an alternate environment, the two buses are combined into a single system bus. Furthermore, although computer system 100 is shown in FIG. 1 as having several user interface and memory devices, these devices are exemplary devices. In alternate embodiments more, or fewer, user interface and memory devices can be employed.

Typically, the user will enter commands to central processing unit 110 by keyboard 132, mouse 134 or pen based tablet 138. In response, central processing unit 110 will execute the commands and provide a display on monitor 136. In this way, the user can interface with central processing unit 110.

When central processing unit 110 executes a user command, it will typically need to retrieve data and instructions from memory devices over memory bus 120. Main memory 122 is typically fast access volatile memory such as static random access memory (SRAM). Disk memory 128, on the other hand, is nonvolatile memory such as a hard disk or floppy disk. In contrast to main memory 122, disk memory 128 typically has a much slower access time but a much greater storage capacity. Cache memory 126 is typically volatile memory that has both a memory capacity and an access time generally in between that of main memory 122 and disk memory 128. During the execution of a program, central processing unit 110 will work directly from information stored in main memory 122 due to its quick access speed. This information is usually stored on disk memory 128 and copied into main memory 122 as required. Frequently used information from disk memory 128 that cannot be stored in main memory 122 is stored in cache memory 126.

Flash memory 124 combines the nonvolatility of disk memory 128 with the speed of access of main memory 122. Although flash memory 124 can be read from quickly, writing to flash memory 124 through a program word command is a relatively slow operation. Furthermore, if a block of memory within flash memory 124 is to be erased, the erase block operation is extremely time consuming. One of the reasons that flash memory 124 can be read from quickly is because flash memory 124 has address transition circuitry 200 that permits flash memory 124 to prepare for a read operation as soon as an address transition is detected.

Address transition circuitry 200 detects any transition on the address lines of memory bus 120. Upon detection of an address transition, address transition circuitry 200 prepares flash memory to read the data stored at the new address. If noise on memory bus 120 causes a rapid address transition to an invalid address and then back to the proper address, address transition circuit 200 will guarantee that the read preparation circuitry of flash memory 124 will have time to stabilize before a read occurs.

Although the present invention will be described in an embodiment for a nonvolatile memory device, it is to be understood that this embodiment is merely an example embodiment and the present invention has application in any device requiring the detection of the transition of one or more signal values. Moreover, the present invention has application in any device requiring the generation, in response to an input pulse that possibly has less than a minimum length duration, of an output pulse guaranteed to have at least the minimum duration.

Figure 2:
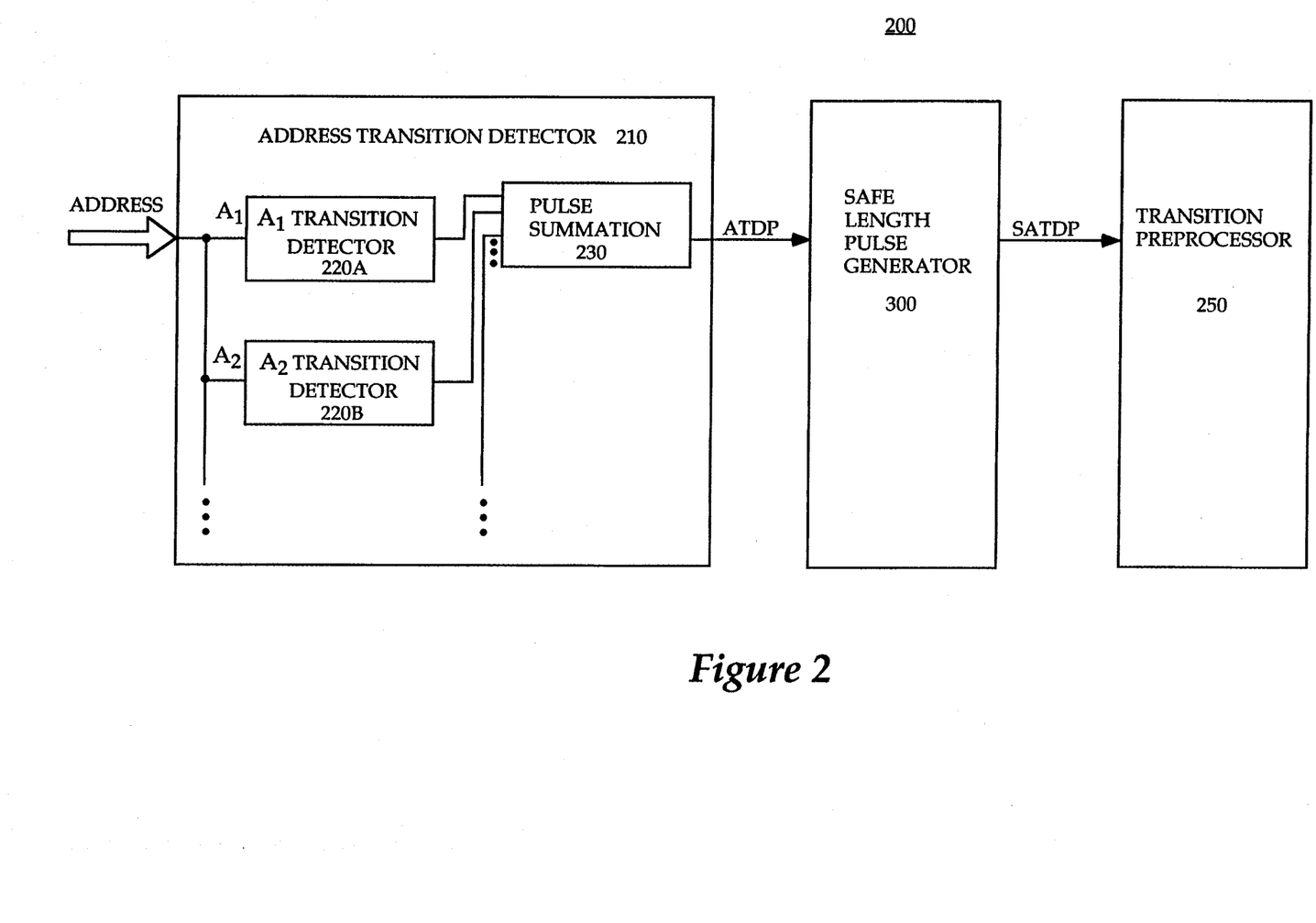
FIG. 2 is a block diagram of the address transition detection circuitry for the nonvolatile memory device.

Referring now to FIG. 2, a block diagram of the address transition circuitry for the nonvolatile memory device is illustrated. Address transition circuitry 200 has three functional components. These components are address transition detector 210, safe length pulse generator 300 and transition preprocessor 250. The input to address transition detector 210 is a multi bit address signal specifying an address to be read. Address transition detector 210 detects a change in one or more bits of the input address signal. Single bit transition detectors, such as $A_1$ transition detector 220A and $A_2$ transition detector 220B, each detect a transition on a different address bit line of the multi bit address signal and pulse summation circuit 230 combines these detections into a single address detection signal. Thus, upon detecting an address transition, address transition detector 210 generates an address transition detected pulse (ATDP).

In the prior art, pulse ATDP would feed directly into transition preprocessor 250. Upon receipt of pulse ATDP, transition preprocessor 250 will prepare the memory array for the read operation of the new address. When pulse ATDP ends, transition preprocessor 250 will be ready for the read signaled by the new address. If the address transition detected by address transition detector 210 was caused by noise on its input address line, pulse ATDP may be so short that transition preprocessor 250 would be unable to prepare the memory array for the upcoming read. In such a case, the ensuing read that would occur when pulse ATDP ended would be made before transition preprocessor 250 circuitry had stabilized and an unreliable read would ensue.

In the present invention, address transition circuitry 200 includes safe length pulse generator 300. Rather than inputting pulse ATDP directly into transition preprocessor 250, pulse ATDP is input to safe length pulse generator 300. Safe length pulse generator 300, in turn, provides signal SATDP as output into transition preprocessor 250 in place of signal ATDP. Safe length pulse generator 300 generates pulse SATDP in response to receipt of input pulse ATDP. Safe length pulse generator 300 ensures that output pulse SATDP is at least as long as is necessary to permit transition preprocessor 250 to stabilize before a read operation occurs. In the case where pulse ATDP is shorter than the minimum safe pulse length, safe length pulse generator 300 extends the pulse and generates a SATDP pulse that has a safe length. In the case where pulse ATDP is longer than the minimum safe length, pulse SATDP generated by safe length pulse generator 300 will be at least as long as the input pulse ATDP.

Figure 3:
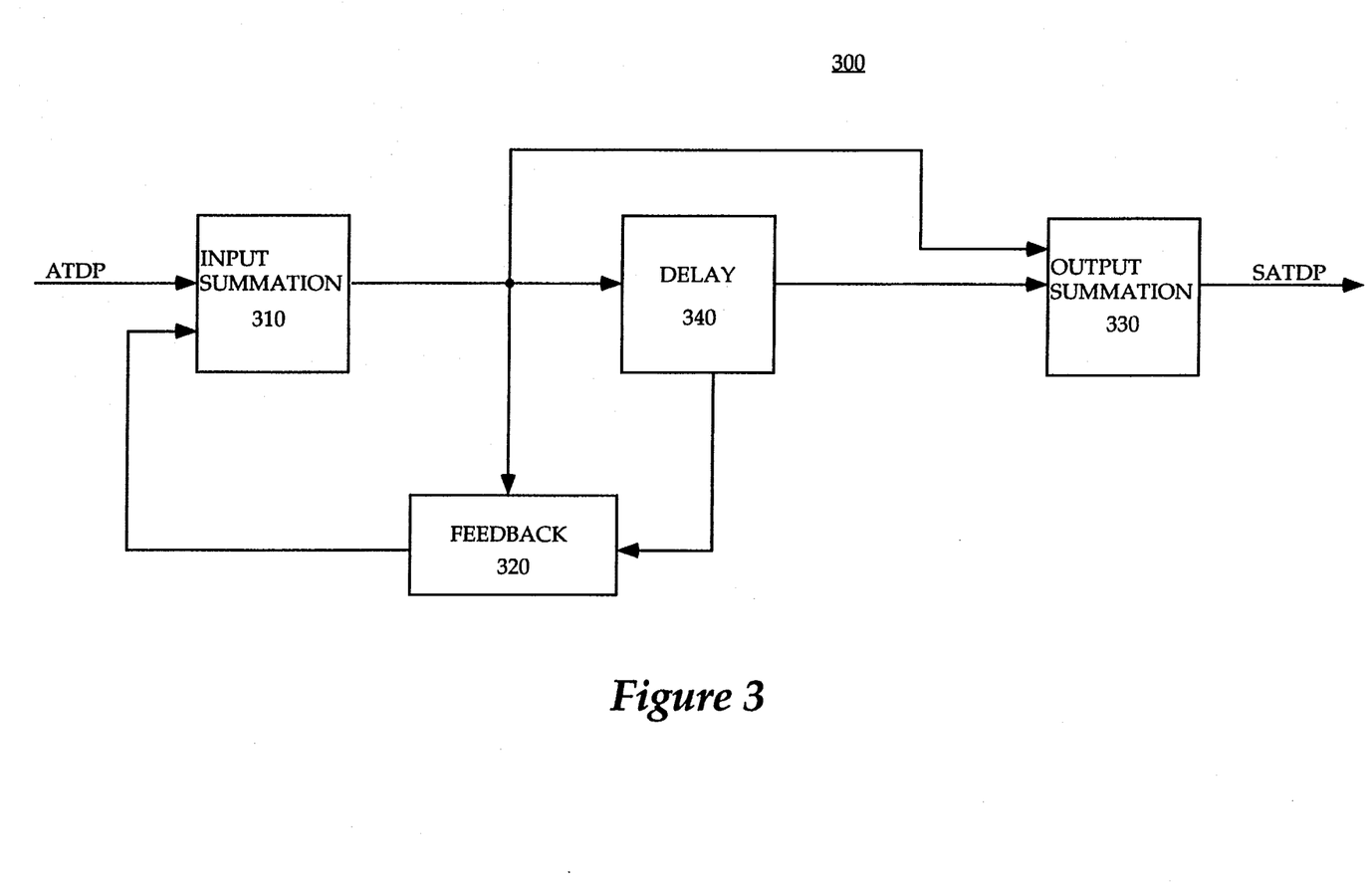
FIG. 3 is a block diagram of the safe pulse generation circuit of the address detection circuitry.

Referring now to FIG. 3, a block diagram for the safe length pulse generator circuit is presented. Safe length pulse generator 300 is made up of four functional blocks. These are input summation block 310, feedback block 320, delay block 340 and output summation block 330. During the normal steady state, input signal ATDP is low (logical 0) and output signal SATDP is low. When an address transition has been detected, signal ATDP will transition high (logical 1) causing the output of input summation block 310 to transition from a low to a high. Note that although in the following description, logical zero will be defined to be a low voltage signal and logical one will be defined to be a high voltage signal, in an alternate embodiment, logical zero is defined to be a high voltage signal and logical one will be defined to be a low voltage signal. The output from input summation block 310 is fed forward to output summation block 330 causing output signal SATDP to transition from low to high. The output from input summation 310 is also provided to feedback circuit 320 causing the output of feedback circuit 320 to transition from low to high. The output from feedback circuit 320 is then provided as input to input summation circuit 310 and holds the output of input summation 310 to the high state regardless of the value of input signal ATDP.

The output from input summation signal 310 is also provided to delay circuit 340. After a predetermined delay, the output from delay circuit 340 will change and cause feedback circuit 320 to reset. A reset of feedback circuit 320 causes the output provided as input to input summation 310 to transition back to low. If pulse ATDP has been a short pulse caused by noise, signal ATDP will have transitioned back to low before feedback circuit 320 resets. Thus, when feedback circuit 320 resets, the output of input summation 310 will no longer be held high and the feed forward of the output from input summation 310 to output summation 330 will transition to low.

Returning to delay circuit 340, the delay of delay circuit 340 holds the output SATDP of output summation 330 high during the delay. Upon termination of the delay period, delay circuit 340 resets to cause an output from delay circuit 340 that permits SATDP output from output summation circuit 330 to go low if the feed forward signal also permits this. In the case of a short ATDP, when the feedback circuit 320 resets, because pulse ATDP will have ended, the feed forward signal will also permit output summation 330 to terminate output pulse SATDP. Therefore, unsafe, short input pulse ATDP will have been extended by delay circuit 340 to form output pulse SATDP having a length where a safe pulse will have been generated as output SATDP.

Returning now to the case of a pulse longer than the minimum safe length, this pulse will begin with a transition on pulse ATDP. As a result, input summation 310 will provide an output to output summation 330, delay circuit 340, and feedback circuit 320. The input to feedback circuit 320 will cause the output of feedback circuit 320 to force the output of input summation 310 into a pulse detected state. The output of input summation circuit 310 will be fed forward to output summation 330 causing output pulse signal SATDP to begin. The output from input summation 310 will also be input to delay circuit 340 causing the beginning of the delay period.

When the delay period ends, the output from delay circuit 340 to output summation circuit 330 will permit output summation circuit 330 to terminate pulse SATDP as soon as the feed forward from input summation circuit 310 ends.

The output of delay circuit 340 to feedback circuit 320 that also occurs at the end of the delay period will cause feedback circuit 320 to reset and release input summation circuit 310. In this case, however, because signal ATDP is a long pulse, pulse ATDP will not have ended and input summation circuit 310 will not change its output until pulse ATDP ends. When pulse ATDP ends, the feed forward output from input summation 310 will cause output pulse SATDP from output summation 330 to terminate. Therefore, a safe, long input pulse ATDP will not have to be extended by delay circuit 340 to form output pulse SATDP and the pulse SATDP will have a length a safe pulse length at least as long as the input ATDP pulse.

Figure 4:
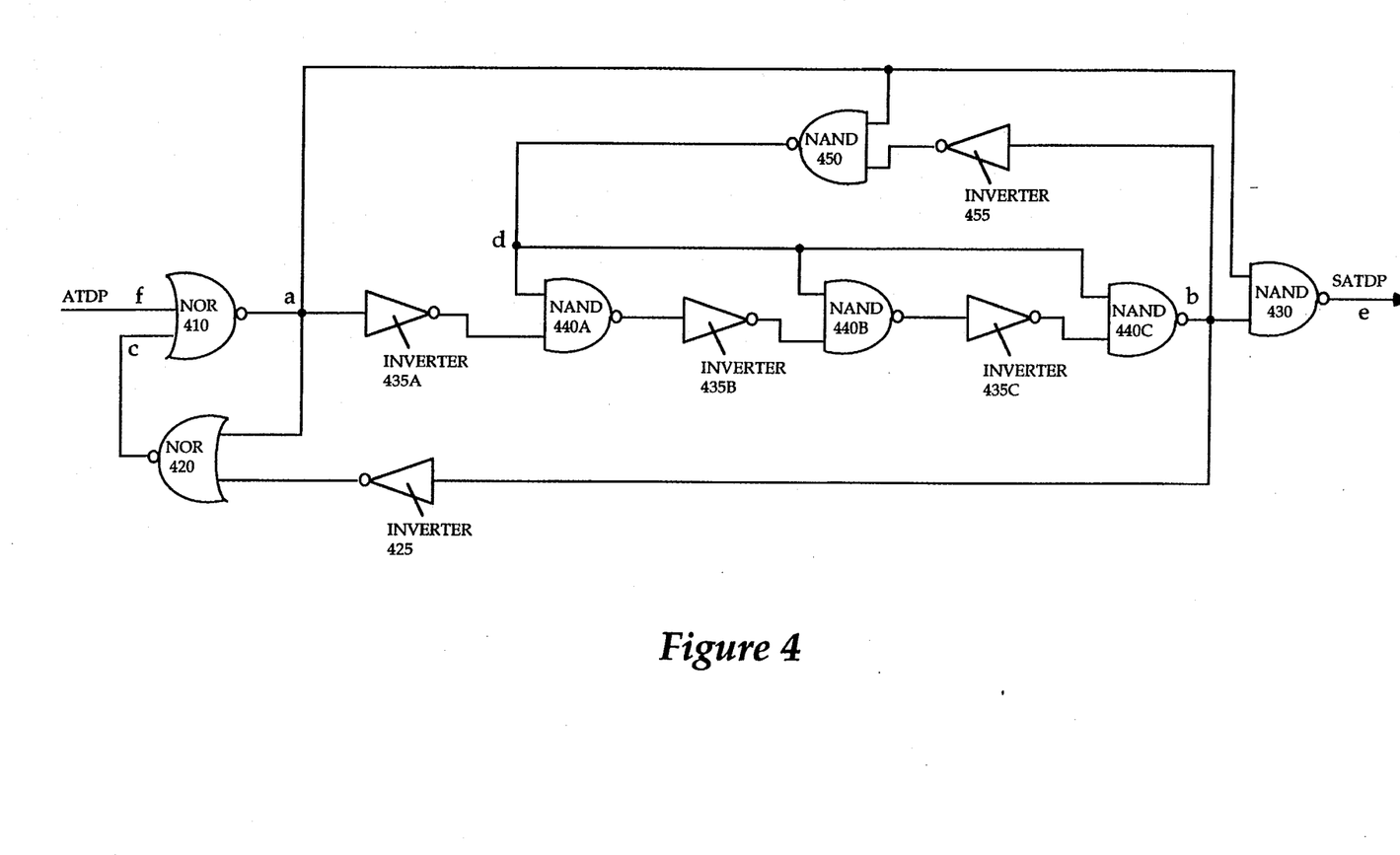
FIG. 4 is an embodiment of the safe pulse generation circuit.

Referring now to FIG. 4, an embodiment of safe pulse length generator 300 is illustrated. In FIG. 4, there are three kinds of well known logic circuit components presented. There are inverters, NOR gates and NAND gates. Each of these logical components introduces a small delay between its input and its output. Furthermore, it will be understood that the components presented in the circuit of FIG. 4 are representative of one embodiment. In alternate embodiments, other logical components can be combined to form the functionality of the circuit of FIG. 3.

An inverter has the characteristic that its output is the compliment of its input. Thus, if the input to an inverter is logical one (high) then the output from the inverter will be logical zero (low). Conversely, if the input to an inverter is low, then the output from the inverter will be high. Note that although in the following description, logical zero will be defined to be a low voltage signal and logical one will be defined to be a high voltage signal, in an alternate embodiment, logical zero is defined to be a high voltage signal and logical one will be defined to be a low voltage signal.

A NOR gate has the property that its output will be low unless both inputs are also low. In the case where both inputs to the NOR gate are low, the output of the NOR gate will be high. Thus, so long as one input to a NOR gate is held high, the output of the NOR gate will be held low.

A NAND gate, on the other hand, has the property that its output will be high unless both inputs are low. Thus, so long as at least one input to a NAND gate is high, the output of the NAND gate will also be high. Note that if one input to a NAND gate is held low, then the NAND gate becomes an inverter for the other input.

Comparing FIG. 4 to FIG. 3, it can be seen that NOR gate 410 of FIG. 4 performs the function of input summation circuit 310 of FIG. 3. Furthermore, in FIG. 4, NOR gate 420, in combination with inverter 425, perform the feedback function of feedback block 320 of FIG. 3. Moreover, NAND gate 430 of FIG. 4 performs the output summation function of output summation block 330 of FIG. 3. Finally, inverters 435A–C working in combination with NAND gates 440A–C of FIG. 4 form a delay chain for delay circuit 340 of FIG. 3. The length of the delay chain is selected to be long enough to guarantee the generation of a safe pulse having at least the minimum safe length. If the delay chain is to be shortened (i.e. the minimum safe length pulse is to be shortened), one or more inverter and NAND gates can be eliminated from the delay chain. Conversely, if the delay chain is to be lengthened (i.e. the minimum safe length pulse is to be lengthened), one or more inverter and NAND gates can be added to the delay chain. Additionally, in FIG. 4, inverter 455 in conjunction with NAND gate 450 function as a reset circuit for the delay chain.

Figure 5:
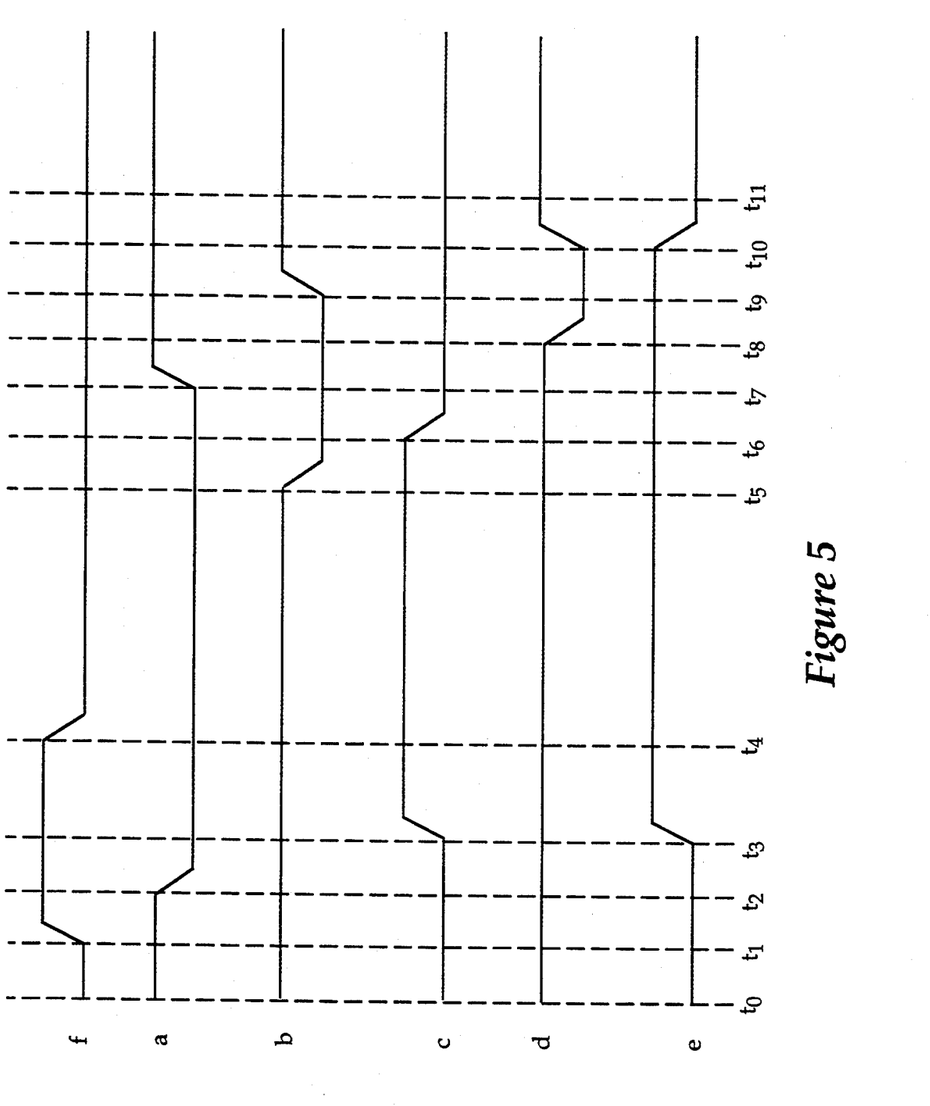
FIG. 5 is a timing diagram illustrating operation of the safe pulse generation circuit when an address detection pulse of unsafe length is received; and, FIG. 6 is a timing diagram illustrating operation of the safe pulse generation circuit when an address detection pulse of a safe length is received.
Figure 6:
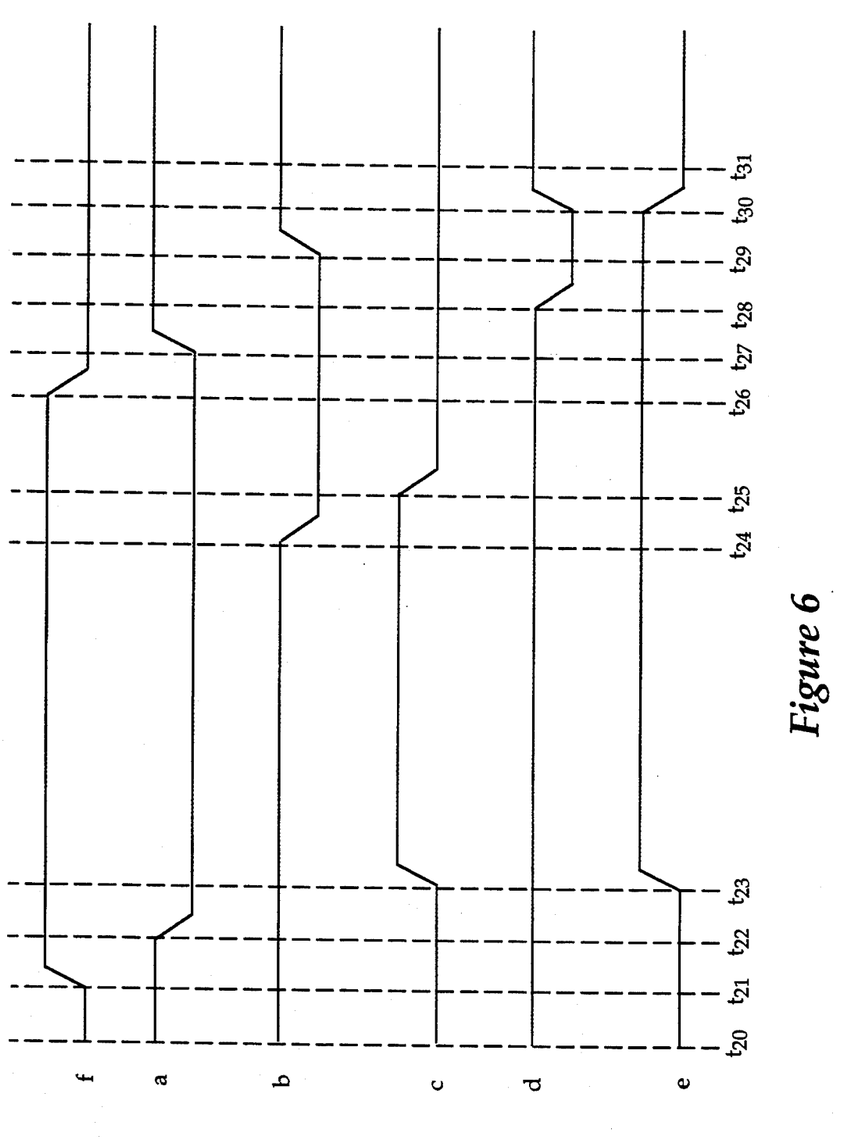

The operation of the circuit of FIG. 4 is best described through the timing diagrams of FIGS. 5 and 6. FIG. 5 presents a timing diagram of the operation of the circuit of FIG. 4 when a short pulse caused by noise is input on signal line ATDP. FIG. 6, on the other hand, illustrates the operation of the circuit of FIG. 4 when a pulse sufficiently long to be safe, is input on signal line ATDP.

In FIGS. 5 and 6, six signals are illustrated. Signal ATDP is the input signal to the circuit appearing at node b of FIG. 4 and is a pulse that signals the detection of an address transition. Signal SATDP is the output of the circuit appearing at node e of FIG. 4 and is a safe address transition detection pulse having a pulse duration at least as long as the minimum amount necessary for the transition processor circuitry to stabilize.

The signals at nodes a, b, c and d are all internal signals for the circuit of FIG. 4. The signal at node a is the output of NOR gate 410. Thus the signal at node a is the output signal from the input summation circuit. The signal at node b is the signal which is output at the end of the delay chain (i.e. the output of NAND gate 440). The signal at node c is the signal output from NOR gate 420. Thus the signal at node a is the output signal from the feedback circuit. Finally, the signal at node d is the signal output from NAND gate 450 of the delay chain reset circuit.

FIG. 5 begins at time $t_O$ with the circuit in its steady state ready for the reception of an address transition detection pulse. In the steady state, input signal ATDP and output signal SATDP are both low. In the steady state, the signal at node c is low and the signals at nodes a, b and d are high. At time $t_1$, signal ATDP transitions from low to high, and an address transition detection pulse is received by NOR gate 410 (the input summation circuit).

Because one input to NOR gate 410 has a transition to high at time $t_1$, a short time later, at time $t_2$, the output from NOR gate 410 (i.e. the signal at node a) transitions from high to low. The high to low transition of the signal at node a at time $t_2$ causes several things to happen. First, the signal at node a is fed forward to NAND gate 430 (the output summation circuit), and a transition from high to low causes output signal SATDP from NAND gate 430 to transition from low to high at time $t_3$. Thus, the safe output pulse begins at time $t_3$.

Secondly, the transition from low to high of the signal at node a at time $t_2$ causes one of the inputs of NOR gate 420 (the feedback circuit) to transition from low to high. This in turn causes the output of NOR gate 420 (the signal at node c) to transition from low to high at time $t_3$. Because the signal at node c is high, the output from NOR gate 410 (i.e. the signal at node a) will remain low as long as the signal at node c remains high. Thus, the end of the short, unsafe length pulse ATDP causing a transition from high to low of input signal ATDP at time $t_4$ will have no impact on the value of the output of NOR gate 410 (the signal at node a). Because the signal at node a is fed forward to NAND gate 430 and holds the output of NAND gate 430 high, the output signal SATDP will remain high so long as the signal at node c remains high.

The third thing that the transition from high to low of the signal at node a at time $t_2$ causes is the enabling of the reset circuit for the delay chain. Because the signal at node a is held low, the signal at node d can transition low if the complement of the signal at node b input to NAND gates 450 from inverter 455 goes high (i.e. the signal at node b goes low).

The fourth thing that the transition from high to low of the signal at node a at time $t_2$ causes is the beginning of the delay created by the delay chain formed by inverters 435A–C and NAND gates 430A–C. Because the signal at node d is held high by the complement of the signal at node b, NAND gates 440A–C each function as inverters. Thus, each inverter and NAND gate in the delay chain inverts (and delays) the signal at node a. Because there are an even number of inverters in the delay chain, the signal at node b will become the same as the signal at node a after the delay caused by the delay chain. Thus, the transition of the signal at node b from high to low at time $t_5$ (in response to the transition of the signal at node a from high to low at time $t_2$) will not occur until the delay period caused by the delay chain has elapsed.

The transition of the signal at node b from high to low at time $t_5$ will have three effects. First, the compliment of the signal at node b will be input to NAND gate 450 (the delay chain reset) and NOR gate 420 (the feedback circuit reset). A transition in the input of NOR gate 420 will cause the output of NOR gate 420 (i.e. the signal at node c) to transition from high to low at time $t_6$. Because signal ATDP has already transitioned low, this will cause the output from the input summation circuit NOR gate 410 (i.e. the signal at node a) to transition from low to high at time $t_7$.

Because the compliment of the signal at node b has already transitioned from low to high and is input to delay chain reset NAND gate 450, when the signal at node a transitions from low to high at time $t_7$ the output from NAND gate 450 (the signal at node d) will transition from high to low at time $t_8$. This will force the reset of the delay chain and the output of the delay chain will transition to a high value. Thus the signal at node b (the output of the delay chain) will transition from low to high at time $t_9$. Because both of the inputs to NAND gate 430 are now high (i.e. the signal at node a and the signal at node b), the output of NAND gate 430 (signal SATDP) will transition from high to low at time $t_{10}$.

Furthermore, because the signal at node b transitioned from low to high at time $t_9$, the compliment of the signal at node b will transition low and force NAND gate 450 to reset the signal at node d to high at time $t_{10}$. Thus, at time $t_{11}$, the circuit will have returned to its steady state and be ready for the receipt of another address transition detection pulse. In the meantime, the circuit has extended an address transition detection pulse of an unsafe length to an output safe address transition detection pulse having a safe length.

FIG. 6 illustrates the operation of the circuit of FIG. 4 when a pulse sufficiently long to be safe is input on signal line ATDP. FIG. 6 begins at time $t_{20}$ with the circuit in its steady state ready for the reception of an address transition detection pulse. In the steady state, input signal ATDP and output signal SATDP are both low. In the steady state, the signal at node c is low and the signals at nodes a, b and d are high. At time $t_{21}$, signal ATDP transitions from low to high, and an address transition detection pulse is received by NOR gate 410 (the input summation circuit).

Because one input to NOR gate 410 has a transition to high at time $t_{21}$, a short time later, at time $t_{22}$, the output from NOR gate 410 (i.e. the signal at node a) transitions from high to low. The high to low transition of the signal at node a at time $t_{22}$ causes several things to happen. First, the signal at node a is fed forward to NAND gate 430 (the output summation circuit), and a transition from high to low causes output signal SATDP from NAND gate 430 to transition from low to high at time $t_{23}$. Thus, the safe output pulse begins at time $t_{23}$.

Secondly, the transition from low to high of the signal at node a at time $t_{22}$ causes one of the inputs of NOR gate 420 (the feedback circuit) to transition from high to low. This in turn causes the output of NOR gate 420 (the signal at node c) to transition from high to low at time $t_{23}$. Because the signal at node c is high, the output from NOR gate 410 (i.e. the signal at node a) will remain low as long as the signal at node c remains high. Because the signal at node a is fed forward to NAND gate 430 and holds the output of NAND gate 430 high, the output signal SATDP will remain high so long as the signal at node c remains high. In the example of the previous figure, the end of the short, unsafe length pulse ATDP causing a transition from high to low of input signal ATDP had no impact on the value of the output of NOR gate 410 (the signal at node a). As will be demonstrated, in the present example, the end of the long, safe length pulse ATDP causing a transition from high to low of input signal ATDP at time $t_{26}$ has an impact on the value of the output of NOR gate 410 (the signal at node a) because it will occur after the signal at node c provided by the feedback circuit has been released by the reset of the feedback circuit at the end of the delay period of the delay chain.

The third thing that the transition from high to low of the signal at node a at time $t_{22}$ causes is the enabling of the reset circuit for the delay chain. Because the signal at node a is held high, the signal at node d can transition low if the complement of the signal at node b input to NAND gates 450 from inverter 455 goes high (i.e. the signal at node b goes low).

The fourth thing that the transition from high to low of the signal at node a at time $t_{22}$ causes is the beginning of the delay created by the delay chain formed by inverters 435A–C and NAND gates 440A–C. Again, because the signal at node d is held high by the signal at node a being held low, NAND gates 440A–C each function as inverters. Thus, each inverter and NAND gate in the delay chain inverts (and delays) the signal at node a. Because there are an even number of inverters in the delay chain, the signal at node b will become the signal at node a after the delay caused by the delay chain. Thus, the transition of the signal at node b from high to low at time $t_{24}$ (in response to the transition of the signal at node a from high to low at time $t_{22}$) will not occur until the delay period caused by the delay chain has elapsed.

The transition of the signal at node b from high to low at time $t_{24}$ will have three effects. First, the compliment of the signal at node b will be input to NAND gate 450 (the delay chain reset) and NOR gate 420 (the feedback circuit reset). A transition in the input of NOR gate 420 will cause the output of NOR gate 420 (i.e. the signal at node c) to transition from high to low at time $t_{25}$. Because signal ATDP has not yet transitioned low, this will free the output from the input summation circuit NOR gate 410 (i.e. the signal at node a) to transition from low to high at time $t_{27}$ when signal ATDP transitions low at time $t_{26}$.

Because the compliment of the signal at node b has already transitioned from low to high and is input to delay chain reset NAND gate 450, when the signal at node a transitions from low to high at time $t_{27}$ the output from NAND gate 450 (the signal at node d) will transition from high to low at time $t_{28}$. This will force the reset of the delay chain and the output of the delay chain will transition to a high value. Thus the signal at node b (the output of the delay chain) will transition from low to high at time $t_{29}$. Because both of the inputs to NAND gate 430 are now high (i.e. the signal at node a and the signal at node b), the output of NAND gate 430 (signal SATDP) will transition from high to low at time $t_{30}$.

Further, because the signal at node b transitioned from low to high at time $t_{29}$, the compliment of the signal at node b will transition low and force NAND gate 450 to reset the signal at node d to high at time $t_{30}$. Thus, at time $t_{31}$, the circuit will have returned to its steady state and be ready for the receipt of another address transition detection pulse. In the meantime, the circuit has generated an output safe address transition detection pulse having a safe length from an address transition detection pulse of a safe length.

Thus, a method and apparatus has been described for ensuring reliable operation of address transition detection circuitry within a nonvolatile memory device regardless of the presence of noise. Whenever an address transition is detected, even if it is a false transition caused by noise, a safe pulse generation circuit ensures that an address transition detection pulse of sufficient length to set the read preparation circuitry to a ready state. Only one delay chain is employed by the safe pulse generation circuit thereby minimizing the area on the memory chip required to implement the circuit. The length of the delay chain, and hence the delay imposed by the delay chain, is chosen to be sufficiently long to guarantee length pulse will be generated by the safe length pulse generator circuit.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A pulse generator, comprising:
   input summation circuitry for receiving an input pulse and combining the input pulse with a feedback signal to form an input sum signal;
   feedback circuitry for receiving the input sum signal and outputting the feedback signal to the input summation circuitry, the feedback signal holding the input sum signal until the feedback circuit is reset;
   delay circuitry for receiving the input sum signal and, after a predetermined delay, providing as output a delayed signal, the delay signal preparing the delay circuitry to reset, the delayed signal causing the feedback circuitry to reset and therefore no longer output the feedback signal, the cessation of the input sum signal causing the delay circuitry to reset and halt the output of the delay signal; and,
   output summation circuitry for receiving the input sum signal and combining the input sum signal with the delay signal to form an output sum signal.

2. The pulse generator as set forth in claim 1 wherein the input summation circuitry is a NOR gate having the input pulse and the feedback signal as input and the input sum signal as output.

3. The pulse generator as set forth in claim 1 wherein the output summation circuitry is a NAND gate having the input sum signal and the delay signal as input and the output sum signal as output.

4. The pulse generator as set forth in claim 1 wherein the feedback circuitry is a NAND gate having the input sum signal and the complement of the delay signal as input and the feedback signal as output.

5. The pulse generator as set forth in claim 1 wherein the delay circuitry is comprised of:
   delay chain circuitry for receiving the input sum signal, inverting and delaying the input sum signal and then outputting the inverted and delayed input sum signal as the delay signal; and
   delay chain reset circuitry for forcing the delay signal to reset.

6. The pulse generator as set forth in claim 5 wherein the delay chain reset circuitry comprises a NAND gate having the input sum signal and the complement of the delay signal as input and a delay chain reset signal as output.

7. The pulse generator as set forth in claim 6 wherein the delay chain circuitry comprises a NAND gate having the inverted input sum signal and the delay chain reset signal as input and the delay signal as output.

8. The pulse generator as set forth in claim 6 wherein the delay chain circuitry comprises a first NAND gate and a last NAND gate, the first NAND gate having the inverted input sum signal and the delay chain reset signal as input and the last NAND gate having the inverted output signal of the first NAND gate and the delay chain reset signal as input and the delay signal as output.

9. The pulse generator as set forth in claim 8 wherein the delay chain circuitry further comprises at least one intermediate NAND gate coupled between the first and last NAND gate thereby forming a chain.

10. Address transition circuitry comprising
    address transition detection circuitry having as input an address signal and having as output an address transition detected (ATD) pulse, the ATD pulse being generated whenever the address signal changes;
    safe pulse generation circuitry for receiving the ATD pulse and generating a safe address transition detected (SATD) pulse as Output, the SATD pulse being at least as long as the ATD pulse, and if the ATD pulse has less than a predetermined minimum safe duration the SATD pulse being at least as long as the predetermined safe duration, the safe pulse generation circuitry including:
    input summation circuitry for receiving the ATD pulse as an input pulse and combining the input pulse with a feedback signal to form an input sum signal;
    feedback circuitry for receiving the input sum signal and outputting the feedback signal to the input summation circuitry, the feedback signal holding the input sum signal until the feedback circuit is reset;
    delay circuitry for receiving the input sum signal and, after a predetermined delay, providing as output a delayed signal, the delay signal preparing the delay circuitry to reset, the delayed signal causing the feedback circuitry to reset and therefore no longer output the feedback signal, the cessation of the input sum signal causing the delay circuitry to reset and halt the output of the delay signal; and,
    output summation circuitry for receiving the input sum signal and combining the input sum signal with the delay signal to form an output sum signal, the output sum signal being the SATD pulse.

11. A system comprising:
    a processor; and
    a device coupled to the processor, the processor for issuing a command to the device and the device for performing an operation in response to the command, the command having an associated address signal that changes when the command changes, the device having address transition circuitry comprising:
    address transition detection circuitry having as input the address signal and having as output an address transition detected (ATD) pulse, the ATD pulse being generated whenever the address signal changes;
    safe pulse generation circuitry for receiving the ATD pulse and generating a safe address transition detected (SATD) pulse as output, the SATD pulse being at least as long as the ATD pulse, and if the ATD pulse has less than a predetermined minimum safe duration, the SATD pulse being at least as long as the predetermined safe duration, the safe pulse generation circuitry including:

input summation circuitry for receiving the ATD pulse as an input pulse and combining the input pulse with a feedback signal to form an input sum signal;

feedback circuitry for receiving the input sum signal and outputting the feedback signal to the input summation circuitry, the feedback signal holding the input sum signal until the feedback circuit is reset;

delay circuitry for receiving the input sum signal and, after a predetermined delay, providing as output a delayed signal, the delay signal preparing the delay circuitry to reset, the delayed signal causing the feedback circuitry to reset and therefore no longer output the feedback signal, the cessation of the input sum signal causing the delay circuitry to reset and halt the output of the delay signal; and, output summation circuitry for receiving the input sum signal and combining the input sum signal with the delay signal to form an output sum signal, the output sum signal being the SATD pulse.

12. A pulse generator, comprising:

an input summer capable of receiving an input pulse and combining the input pulse with a feedback signal to form an input sum signal;

a feedback element capable of receiving the input sum signal and outputting the feedback signal to the input summer, the feedback signal holding the input sum signal until the feedback element is reset;

a delayer capable of receiving the input sum signal and, after a predetermined delay, providing as output a delayed signal, the delay signal preparing the delayer to reset, the delayed signal causing the feedback element to reset and therefore no longer output the feedback signal, the cessation of the input sum signal causing the delayer to reset and halt the output of the delay signal; and, an output summer capable of receiving the input sum signal and combining the input sum signal with the delay signal to form an output sum signal.

13. The pulse generator as set forth in claim 12 wherein the input summer circuitry is a NOR element having the input pulse and the feedback signal as input and the input sum signal as output.

14. The pulse generator as set forth in claim 12 wherein the output summer circuitry is a NAND element having the input sum signal and the delay signal as input and the output sum signal as output.

15. The pulse generator as set forth in claim 12 wherein the feedback element is a NOR element having the input sum signal and the complement of the delay signal as input and the feedback signal as output.

16. The pulse generator as set forth in claim 12 wherein the delayer is comprised of:

a delay chain capable of receiving the input sum signal, inverting and delaying the input sum signal and then outputting the inverted and delayed input sum signal as the delay signal; and a delay chain resetter capable of forcing the delay signal to reset.

17. The pulse generator as set forth in claim 16 wherein the delay chain resetter comprises a NAND element having the input sum signal and the complement of the delay signal as input and a delay chain reset signal as output.

18. The pulse generator as set forth in claim 17 wherein the delay chain comprises a NAND element having the inverted input sum signal and the delay chain reset signal as input and the delay signal as output.

19. The pulse generator as set forth in claim 17 wherein the delay chain comprises a first NAND element and a last NAND element, the first NAND element having the inverted input sum signal and the delay chain reset signal as input and the last NAND element having the inverted output signal of the first NAND element and the delay chain reset signal as input and the delay signal as output.

20. The pulse generator as set forth in claim 19 wherein the delay chain further comprises at least one intermediate NAND element coupled between the first and last NAND elements thereby forming a chain.

21. A pulse generation method, comprising the steps of:

receiving an input pulse and combining the input pulse with a feedback signal to form an input sum signal;

receiving the input sum signal and generating the feedback signal;

holding the feedback signal until feedback reset;

receiving the input sum signal and, after a predetermined delay, providing as output a delayed signal, the delay signal preparing a delay reset, the delayed signal causing the feedback reset and halting generation of the feedback signal, the cessation of the input sum signal causing the delay reset and halting the generation of the delay signal; and, receiving the input sum signal and combining the input sum signal with the delay signal to form an output sum signal.

* * * * *

UNITED STATES PATENT AND TRADEMARK OFFICE
CERTIFICATE OF CORRECTION

PATENT NO.   :   5,418,479
DATED        :   May 23, 1995
INVENTOR(S)  :   Sachidanandan Sambandan It is certified that error appears in the above-identified patent and that said Letters Patent is hereby corrected as shown below:

In column 7 at line 57 delete "node b" and insert --node f--

Signed and Sealed this

Fifth Day of November, 1996

Attest:

BRUCE LEHMAN

Attesting Officer              Commissioner of Patents and Trademarks